US008611088B2

(12) United States Patent
Barna

(10) Patent No.: US 8,611,088 B2
(45) Date of Patent: Dec. 17, 2013

(54) MECHANICAL HEAT PUMP FOR AN ELECTRICAL HOUSING

(75) Inventor: Kyle Steven Barna, Syracuse, NY (US)

(73) Assignee: Cooper Technologies Company, Houston, TX (US)

( * ) Notice: Subject to any disclaimer, the term of this patent is extended or adjusted under 35 U.S.C. 154(b) by 216 days.

(21) Appl. No.: 13/297,859

(22) Filed: Nov. 16, 2011

(65) Prior Publication Data

US 2013/0120934 A1 May 16, 2013

(51) Int. Cl.
H05K 7/20 (2006.01)

(52) U.S. Cl.
USPC ............... 361/696; 361/679.49; 361/679.53; 361/695; 361/697; 361/701; 165/80.3; 165/104.33; 165/121; 165/122

(58) Field of Classification Search
USPC .............. 361/679.46–679.55, 690–697, 361/702–728; 165/80.2, 80.3, 104.33, 165/121–126, 185; 174/50, 50.5, 520; 312/223.1, 223.2, 236
See application file for complete search history.

(56) References Cited

U.S. PATENT DOCUMENTS

| | | | | |
|---|---|---|---|---|
| 3,356,903 A | * | 12/1967 | Arnold | 361/695 |
| 4,102,475 A | | 7/1978 | Kalvaitis | |
| 4,520,425 A | * | 5/1985 | Ito | 361/697 |
| 4,620,263 A | * | 10/1986 | Ito | 361/690 |
| 4,881,822 A | | 11/1989 | Ridenour | |
| 5,189,256 A | | 2/1993 | Epple | |
| 5,218,516 A | * | 6/1993 | Collins et al. | 361/721 |
| 5,235,491 A | * | 8/1993 | Weiss | 361/694 |
| 5,276,584 A | * | 1/1994 | Collins et al. | 361/718 |
| 5,370,551 A | | 12/1994 | Data | |
| 5,823,378 A | | 10/1998 | Evarts et al. | |
| 5,832,988 A | * | 11/1998 | Mistry et al. | 165/103 |
| 6,175,494 B1 | * | 1/2001 | Komatsu | 361/692 |
| 6,201,705 B1 | * | 3/2001 | Nygren et al. | 361/753 |
| 6,365,826 B1 | | 4/2002 | Stendardo et al. | |
| 6,430,042 B1 | * | 8/2002 | Ohashi et al. | 361/679.49 |
| 6,653,562 B2 | | 11/2003 | Kochanski et al. | |
| 6,940,011 B2 | | 9/2005 | Koike et al. | |
| 7,253,356 B2 | | 8/2007 | Kiyota et al. | |
| 7,335,848 B2 | * | 2/2008 | Hironaga et al. | 219/69.17 |
| 7,423,871 B2 | * | 9/2008 | Schwab | 361/695 |
| 7,457,133 B2 | * | 11/2008 | Chiang et al. | 361/797 |
| 7,785,138 B2 | | 8/2010 | Bonnassieux et al. | |
| 7,795,533 B2 | | 9/2010 | Bravo et al. | |
| 7,800,889 B2 | | 9/2010 | Kato et al. | |
| 7,956,284 B2 | | 6/2011 | Bravo et al. | |
| 2001/0045270 A1 | | 11/2001 | Bhatti et al. | |
| 2003/0107873 A1 | * | 6/2003 | Van Gaal | 361/690 |
| 2003/0117772 A1 | * | 6/2003 | Searls et al. | 361/690 |
| 2004/0257778 A1 | * | 12/2004 | Lee | 361/752 |

(Continued)

FOREIGN PATENT DOCUMENTS

| JP | 40528298 A | * | 10/1993 | H01H 73/06 |
|---|---|---|---|---|
| JP | 02000125571 A | * | 4/2000 | H05K 7/20 |

(Continued)

Primary Examiner — Michail V Datskovsky
(74) Attorney, Agent, or Firm — King & Spalding LLP

(57) ABSTRACT

A system for transferring heat from an electrical enclosure is provided. An electrical enclosure defines a housing area in which one or more electrical devices are housed. A heat pump extends through the electrical enclosure, the heat pump defining a channel configured to communicate fluid for transferring heat from the one or more electrical devices. The electrical enclosure is substantially sealed from the heat pump channel and from other areas outside the electrical enclosure.

19 Claims, 8 Drawing Sheets

(56) References Cited

U.S. PATENT DOCUMENTS

| | | |
|---|---|---|
| 2006/0237208 A1 | 10/2006 | Mangold |
| 2007/0297139 A1 | 12/2007 | Scott et al. |
| 2009/0015125 A1 | 1/2009 | Shuy |
| 2009/0067128 A1* | 3/2009 | Kunz .................. 361/679.53 |
| 2009/0310301 A1 | 12/2009 | Nelson et al. |
| 2010/0079940 A1* | 4/2010 | Mongia et al. ......... 361/679.49 |
| 2010/0218797 A1 | 9/2010 | Coyle, Jr. et al. |
| 2010/0276173 A1 | 11/2010 | Birkenstock et al. |
| 2010/0294528 A1 | 11/2010 | Sella et al. |
| 2010/0302728 A1* | 12/2010 | Knaup et al. .................. 361/690 |
| 2011/0108250 A1* | 5/2011 | Horng et al. .................. 165/121 |

FOREIGN PATENT DOCUMENTS

| | | | | | |
|---|---|---|---|---|---|
| JP | 2001148588 A | * | 5/2001 | ............... | H05K 7/20 |
| JP | 02001291982 A | * | 10/2001 | ............... | H05K 7/20 |
| KR | 1020090029214 | | 3/2009 | | |

* cited by examiner

MECHANICAL HEAT PUMP FOR AN ELECTRICAL HOUSING

TECHNICAL FIELD

The present application relates generally to systems and methods for transferring heat from heat-generating electrical devices in an electrical housing, e.g., a junction box.

BACKGROUND

Electrical devices, e.g., conductors, combiners, switches, controllers, fuses, fuse holders, power distribution blocks, and terminal blocks, generate heat that must be dissipated to regulate the temperature of such devices and surrounding components or structures. Electrical devices may be housed in various types of housings or enclosures. Some electrical device housings have at least one open face, or significant openings for allowing heat to be removed from the electrical devices by air flow through the housings and across the surfaces of the electrical devices. Other electrical device housings are significantly enclosed, and in some cases sealed from the surrounding environment. For example, electrical components of a high voltage, high current (DC current) solar power system may be housed in a sealed enclosure, e.g., an enclosure with a NEMA 4x rating, to provide water resistance or waterproofing. Removing heat from such enclosures is relatively difficult, as they do not include openings for permitting air flow over the heat-producing components.

SUMMARY

Some embodiments of the invention provide systems for transferring heat from heat-generating electrical devices housed in a sealed enclosure, e.g., a sealed junction box for a high voltage solar system. The systems may include one or more mechanical heat pumps that define channels that extend through the sealed enclosure. Air flows through the channels to transfer heat away from the sealed enclosure (and thus, away from the heat-generating electrical devices).

In one aspect of the invention, a system for transferring heat from an electrical enclosure is provided. The electrical enclosure defines a housing area in which one or more electrical devices are housed. A heat pump extends through the electrical enclosure, the heat pump defining a channel configured to communicate fluid for transferring heat from the one or more electrical devices. The electrical enclosure is substantially sealed from the heat pump channel and from other areas outside the electrical enclosure.

In another aspect of the invention, the system includes a plurality of heat pumps extending substantially vertically through the electrical enclosure, each heat pump defining a channel configured to communicate fluid for transferring heat from the one or more electrical devices. Each heat pump channel may be tapered such that a cross-sectional area of a top end of the heat pump channel is smaller than a cross-sectional area of a bottom end of the heat pump channel. The electrical enclosure is substantially sealed from the plurality of heat pump channels and from other areas outside the electrical enclosure.

DETAILED DESCRIPTION OF EXEMPLARY EMBODIMENTS

Figure 1A:
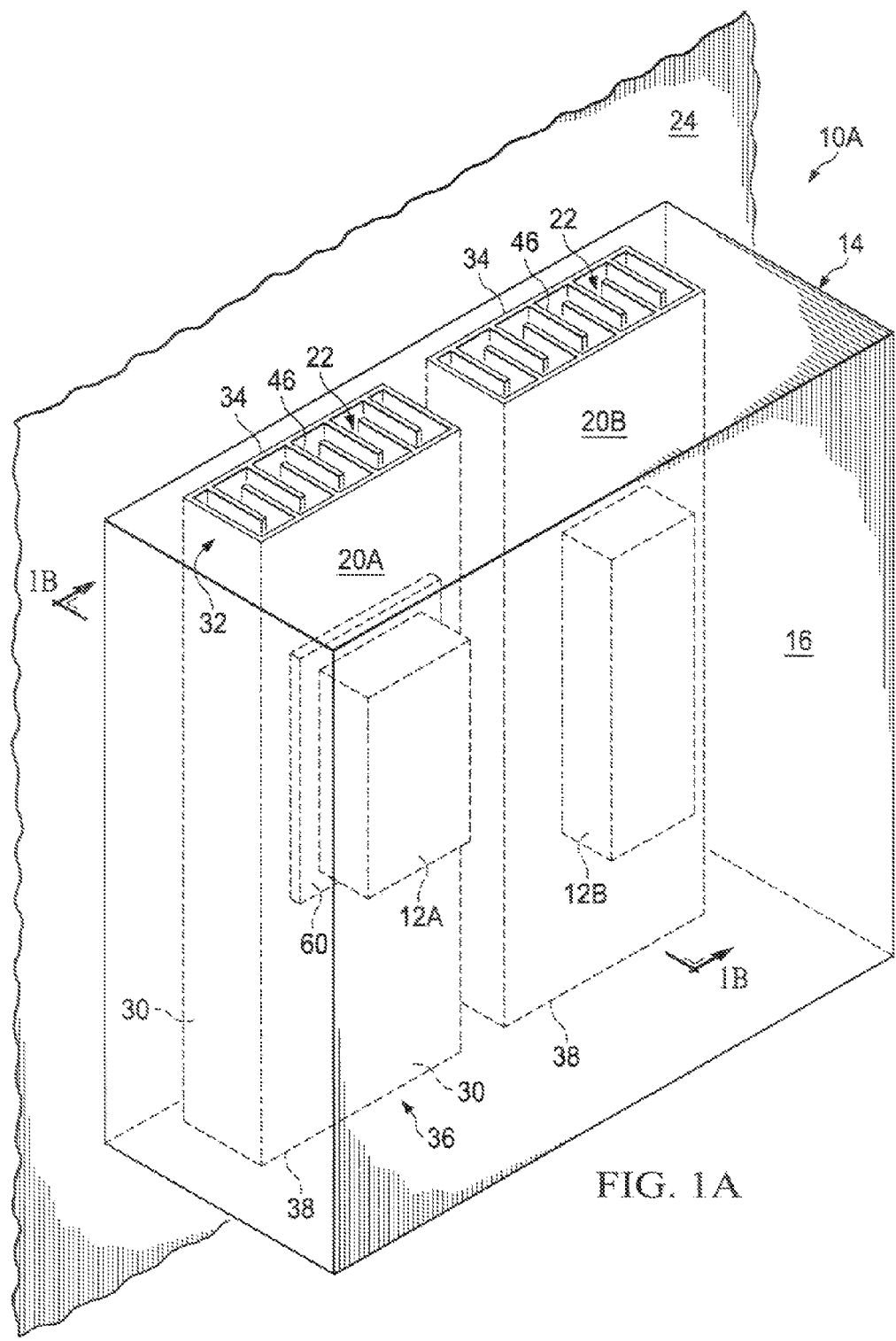
FIGS. 1A and 1B illustrates an example heat transfer system for cooling electrical devices in an electrical housing, according to some embodiments.

The invention may be better understood by reading the following description of non-limitative, exemplary embodiments with reference to the attached drawings wherein like parts of each of the figures are identified by the same reference characters.

The invention relates to systems for transferring heat from heat-generating electrical devices housed in a sealed enclosure, e.g., a sealed junction box for a high voltage solar system. The systems may include one or more mechanical heat pumps that define channels that extend through the sealed enclosure, wherein air flows through the channels to transfer heat away from the sealed enclosure. The term "electrical device" includes any electronics, electrical circuit elements, or electrical conductor (e.g., wiring or electrical connectors). As examples only, electrical device may include conductors, combiners, switches, controllers, fuses, fuse holders, power distribution blocks, terminal blocks, etc. In some example embodiments, the electrical devices are components of a high voltage and/or high current system—for example, a high voltage (e.g., 1000V+), high current (2000 A+ DC current) solar power system—which are housed in a sealed enclosure, e.g., an enclosure with a NEMA 4x rating. The systems discussed herein may be used with electrical devices operating on, or carrying, either A/C or DC current.

Figure 1B:
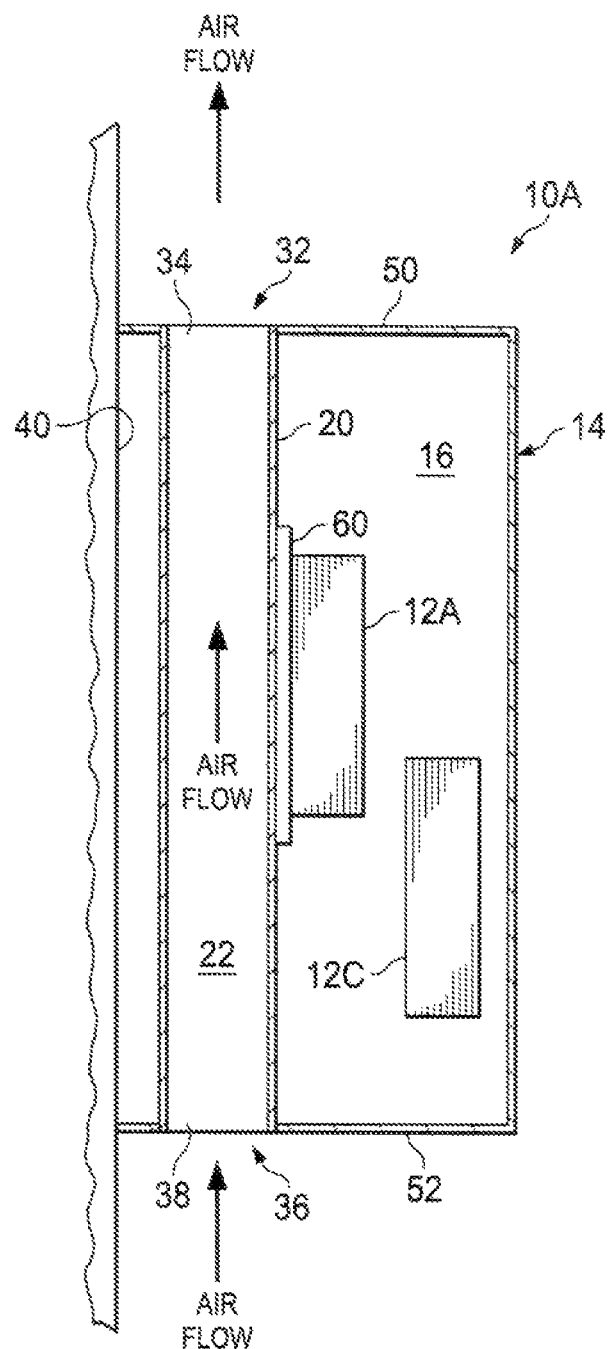

FIGS. 1A and 1B illustrate an example heat transfer system 10A for cooling electrical devices 12 located in an electrical housing 14. FIG. 1A illustrates a three-dimensional view, while FIG. 1B illustrates a cross-sectional side view taken through lines 1B-1B shown in FIG. 1A. As shown, system 10A includes a pair of mechanical heat pumps 20A and 20B extending substantially vertically through electrical housing 14, which may be secured to a surface or wall 24. Each heat pump 20 defines a vertical channel 22 for communicating air or other fluid through the heat pump 20 to provide convective heat transfer away from electrical housing 14, e.g., heat generated by electrical devices 12.

In some embodiments, electrical housing 14 may define an electrical device housing area 16 that is substantially or completely sealed from areas outside of electrical housing 14 and substantially or completely sealed from heat pump channels 22. Thus, electrical housing 14 may be substantially or completely water resistant or waterproof, which may be particularly useful for outdoor enclosures.

In the embodiment shown in FIGS. 1A and 1B, heat pumps 20 may be formed integrally with electrical housing 14, such that particular walls 30 act as both outer walls of heat pumps 20 and inner walls of electrical housing 14, with walls 30 separating the sealed housing area 16 from heat pump channels 22. Alternatively, heat pumps 20 may be formed separately from electrical housing 14, such that heat pumps 20 are inserted into channels defined by internal walls of electrical housing 14.

Each heat pump channel 22 extends from a first end 32 defining a first end opening 34 to a second end 36 defining a second end opening 38. Each opening 34 and 38 may have any suitable shape and/or size. Openings 34 and 38 may have the same shape and/or size, or different shapes and/or sizes. Further, the channel 22 between openings 34 and 38 may have any suitable shape. For example, channel 22 may be straight, curved in one or more directions, tapered in one or more directions, may include any number of turns, may be serpentine or labyrinth shaped, may branch into multiple channels, or may have any other shape or configuration. In the embodiment shown in FIGS. 1A and 1B, openings 34 and 38 are rectangular and equal in size and shape, and channels 22 are straight and parallel.

Figure 2:
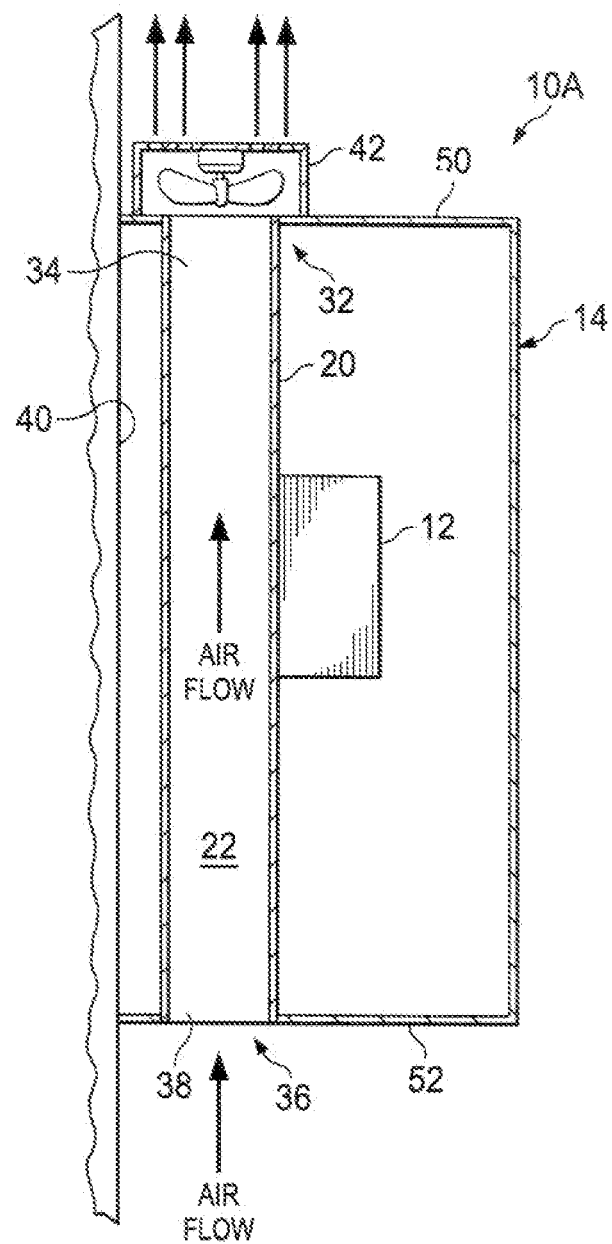
FIG. 2 illustrates a configuration of a heat transfer system that includes a fan for increasing air flow through a heat pump channel, according to some embodiments.

Further, a heat pump 20 may be located at one external side of electrical housing 14 (e.g., with one external wall of electrical housing 14 also acting as a wall of the heat pump 20, such as shown in FIG. 2 discussed below), or may be spaced apart from the external sides of electrical housing 14. In the embodiment shown in FIGS. 1A and 1B, heat pumps 20 are located near, but spaced apart from a rear wall 40 of electrical housing 14. Thus, as best shown in FIG. 1B, housing area 16 extends completely around an outer perimeter of each heat pump 20. Further, a perimeter of each opening 34 and 38 is located within and spaced apart from an outer perimeter of electrical housing 14. In other embodiments, e.g., as shown in FIG. 2, a perimeter of one or both openings 34 and 38 may share one or more edges with an outer perimeter of electrical housing 14.

Each heat pump 20 may extend to, or beyond, a top surface 50 and a bottom surface 52 of electrical housing 14. Each heat pump 20 may include elements for increasing heat transfer and/or directing the air flow as desired. For example, fins, baffles, ridges, screens, or other elements may be provided in channel 22. In the embodiment shown in FIG. 1A, each heat pump 20 includes inter-digitated elements 46 within channel 22 to increasing the surface area exposed to air flowing through channel 22, to increase conductive heat transfer.

Each electrical device 12 may be mounted directly to a wall or walls of one or more heat pumps 20, or to a structure that physically abuts a wall or walls of one or more heat pumps 20, or to a wall of electrical housing 14 and spaced apart from heat pump(s) 20, or otherwise mounted within housing area 16. For example, FIGS. 1A and 1B show an example electrical device 12A mounted to a thermally conductive mounting plate 60, which is mounted to a wall of heat pump 20A; an example electrical device 12B mounted directly to a wall of heat pump 20B; and an example electrical device 12C (shown only in FIG. 1B) that is not mounted to either heat pump 20.

In operation, electrical devices 12 produce heat, which is transferred to a wall or walls of the heat pumps 20 by convection, conduction (e.g., where an electrical device 12 is mounted directly to heat pump(s) 20 or to a thermally conductive structure (e.g., plate 60) in contact with heat pump(s) 20), and/or radiation. The heat wall or walls of heat pumps 20 warm the air within channels 22, which causes the sir to rise through channels 22, thus promoting conductive heat transfer out of electrical housing 14.

Any of the heat transfer systems discussed herein may include any active any passive or active devices for facilitating or increasing air flow through heat pump channels 22. For example, heat transfer system 38 may include passive elements such as a heat sink with fins, or active elements such as fans, etc. FIG. 2 illustrates a configuration of heat transfer system 10A that includes a fan 42 for increasing air flow through channel 22, further promoting conductive heat transfer out of electrical housing 14.

Figure 3:
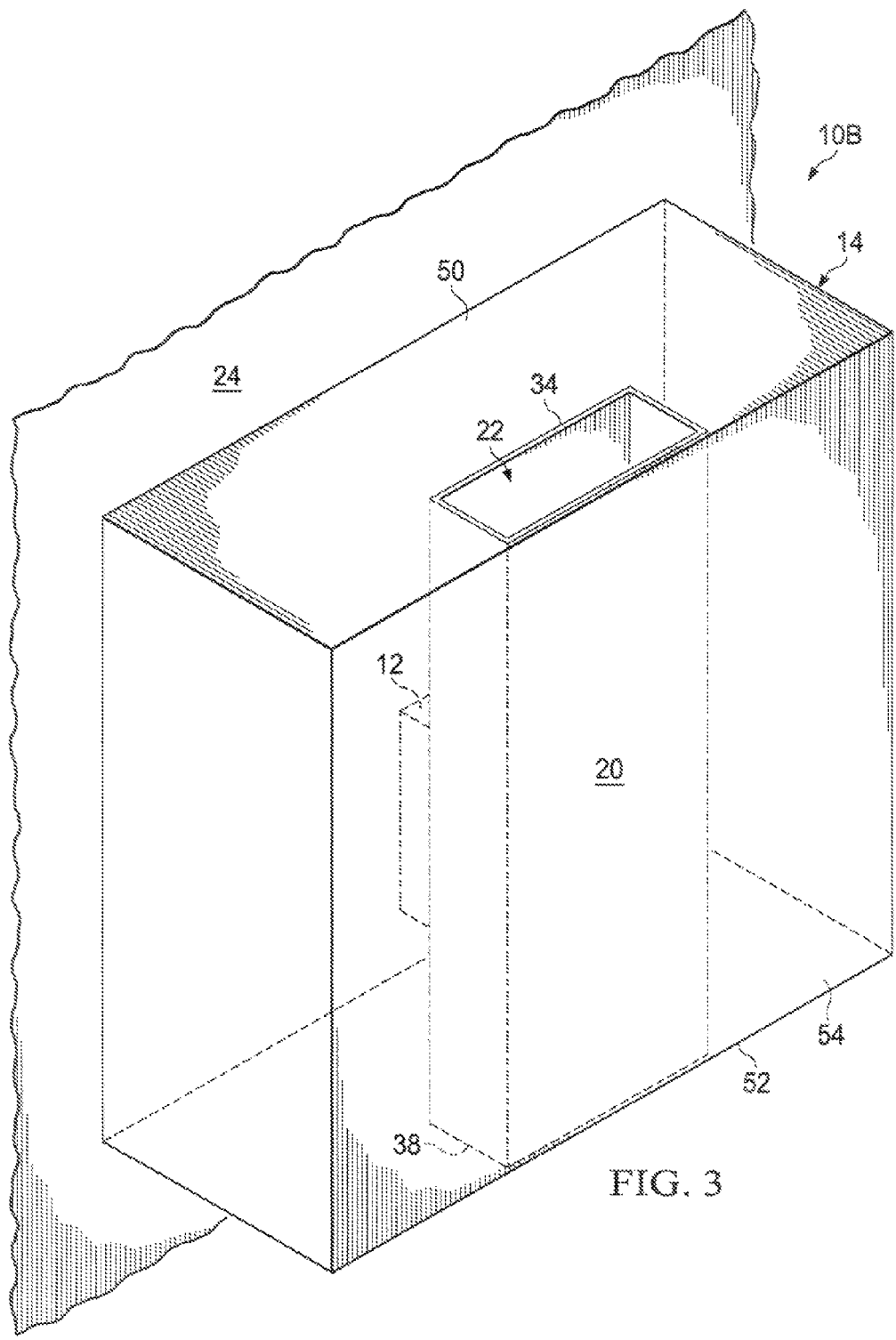
FIG. 3 illustrates an example heat transfer system that includes a vertically extending heat pump is formed located at one side of an electrical housing, according to some embodiments.

FIG. 3 illustrates an example heat transfer system 10B for cooling electrical devices 12 located in an electrical housing 14. In this embodiment, a vertically extending heat pump 20 is formed within, but located at one side of, electrical housing 14 such that an external wall 54 of electrical housing 14 forms one wall of the heat pump 20 (or alternatively, the wall of the heat pump could be mounted directed to external wall 54 of electrical housing 14). Thus, a perimeter of the top opening 34 shares an edge with a perimeter of the top 50 of electrical housing 14, and likewise, a perimeter of the bottom opening 38 shares an edge with a perimeter of the bottom 52 of electrical housing 14. In other embodiments, heat pump 20 could be arranged at any other external wall or walls of electrical housing 14 in a similar manner.

Figure 4:
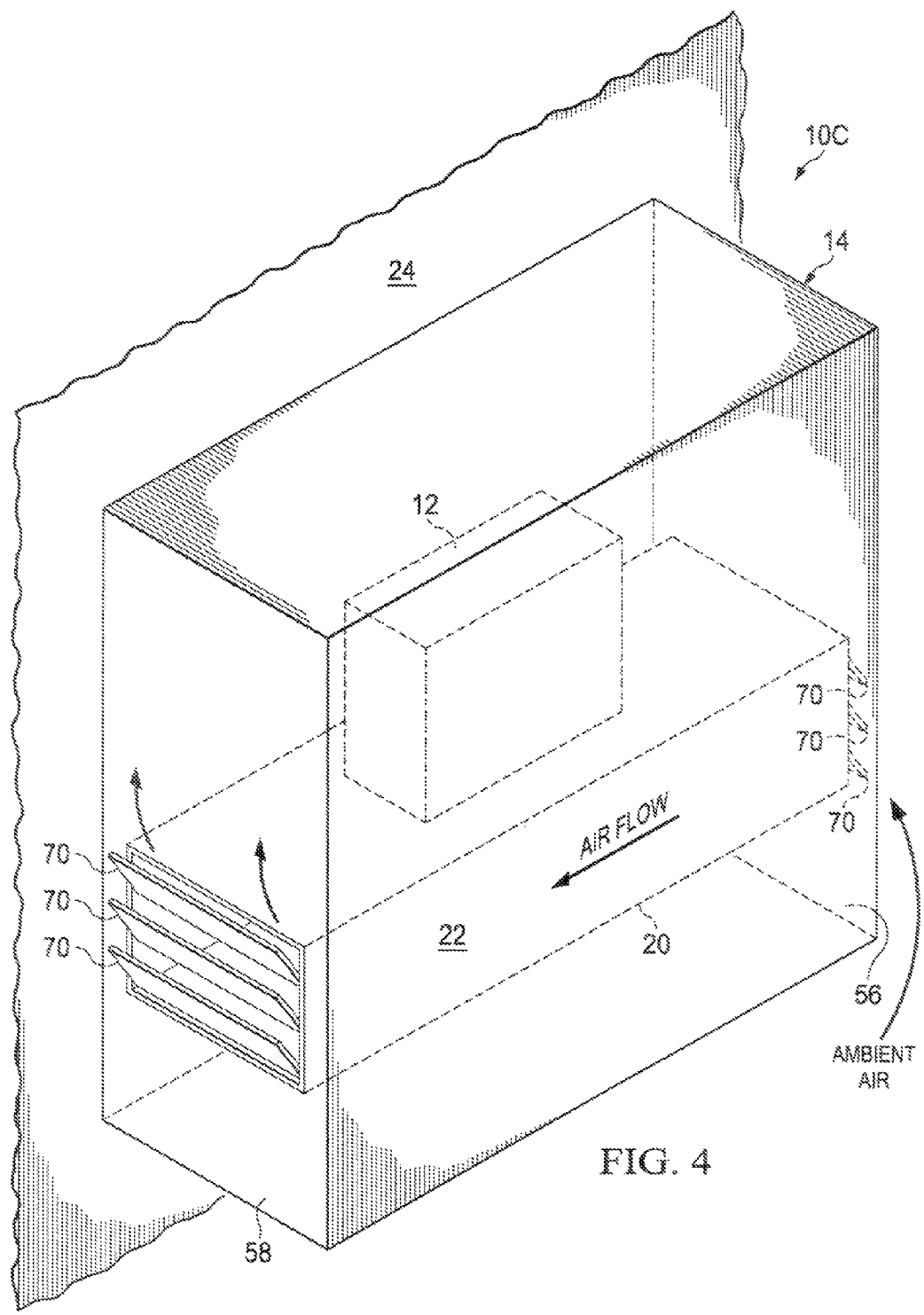
FIG. 4 illustrates an example heat transfer system that includes a heat pump that extends horizontally through an electrical housing, according to some embodiments.

FIG. 4 illustrates an example heat transfer system IOC for cooling electrical devices 12 located in an electrical housing 14. In this embodiment, a heat pump 20 extends substantially horizontally from a first side 56 to a second side 58 of electrical housing 14. Directional vent structures 70 are provided at each of the heat pump channel 22 to facilitate and/or direct air flow through channel 22. Vent structures 70 may include any suitable structures, e.g., fins or louvers, and may be adjustably positioned at desired. In the illustrated example, vent structures 70 comprise louvers positioned at an askew angle relative to the heat pump channel 22, which may promote air flow in the direction indicated by the arrows in FIG. 4.

Figure 5:
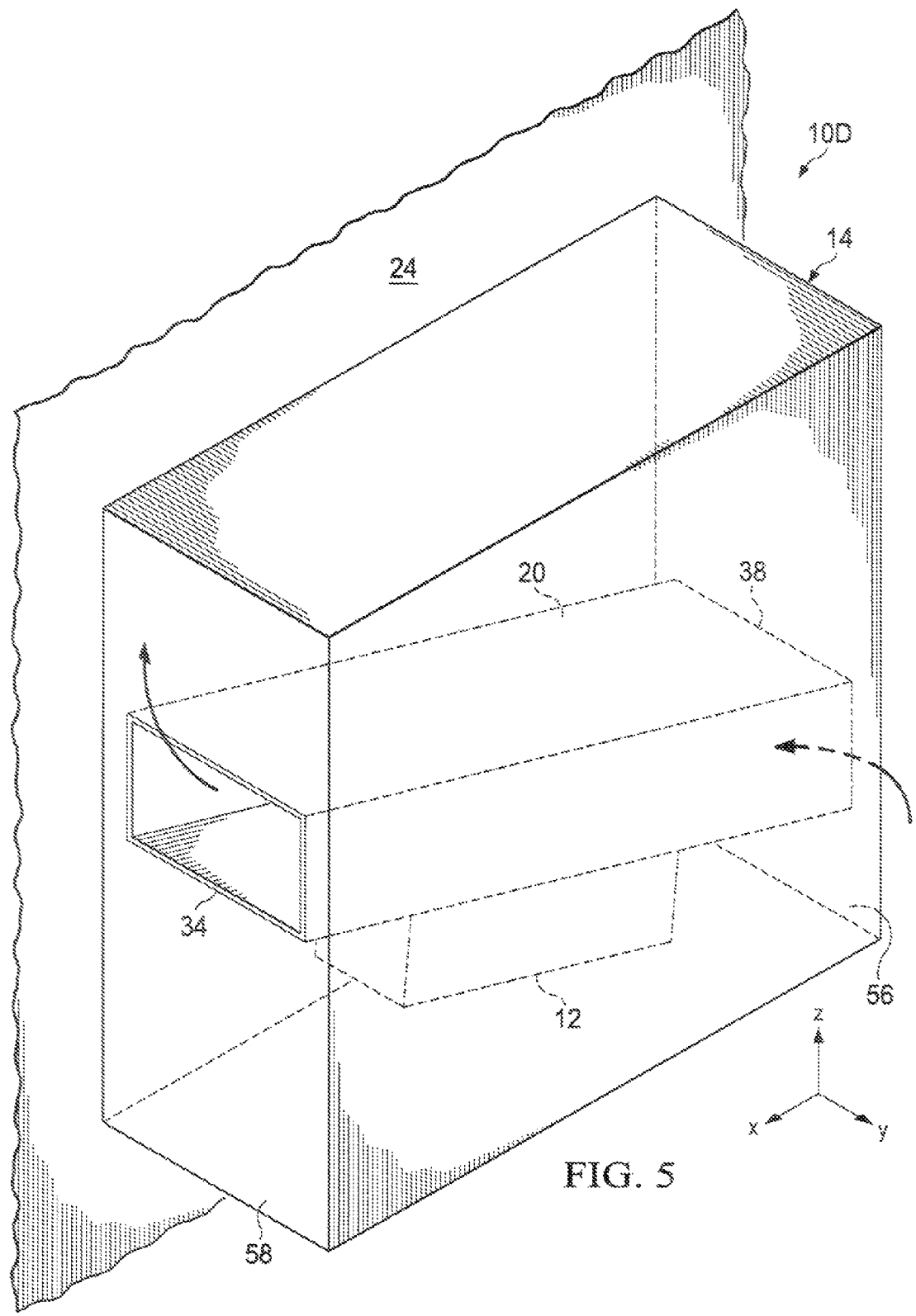
FIG. 5 illustrates an example heat transfer system that includes a heat pump that extends diagonally through an electrical housing. according to some embodiments.

FIG. 5 illustrates an example heat transfer system 10D for cooling electrical devices 12 located in an electrical housing 14. In this embodiment, a heat pump 20 extends diagonally from a first side 56 to a second side 58 of electrical housing 14. Heat pump 20 may be oriented at any angle with respect to the horizontal (i.e., the x-axis shown in FIG. 5), e.g., to provide the desired air flow characteristics at particular temperatures. For example, heat pump 20 may be oriented at an angle between 10 and 80 degrees from the horizontal. In certain embodiments, heat pump 20 may be oriented at an angle between 20 and 45 degrees from the horizontal.

Figure 6:
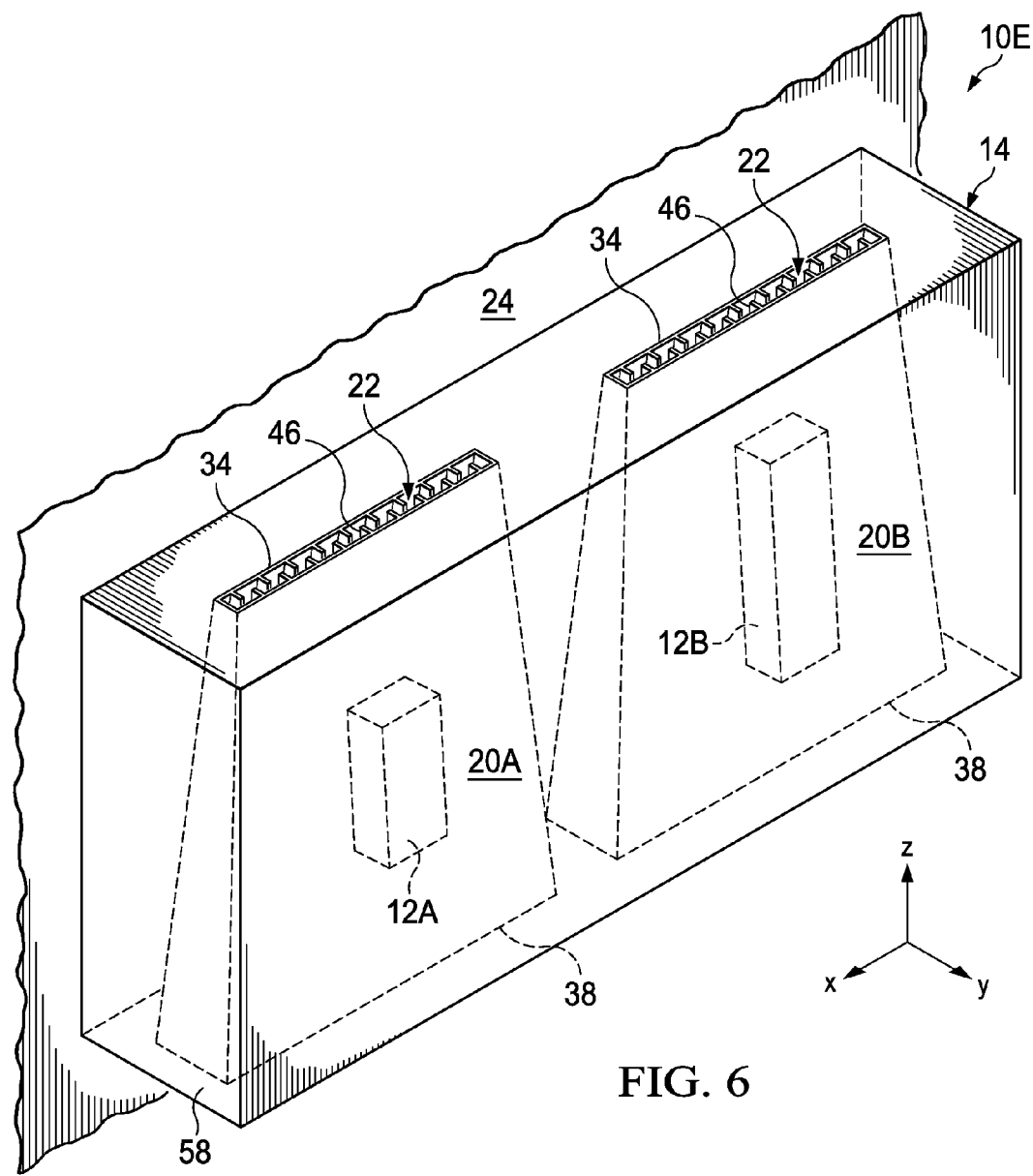
FIG. 6 illustrates an example heat transfer system that includes a heat pump having a generally vertical, tapered channel, according to some embodiments.

FIG. 6 illustrates an example heat transfer system 10E for cooling electrical devices 12A and 12B located in an electrical housing 14. In this embodiment, two heat pumps 20A and 20B extend substantially vertically and each has a tapered channel 22, which may accelerate or otherwise promote the flow of air upwards through channel 22, to increase the heat transfer rate. In particular, channel 22 is tapered in both the x-direction and the y-direction, such that the x- and y-direction dimensions of bottom opening 38 are larger than the x- and y-direction dimensions of top opening 34. Thus, the cross-sectional area of bottom opening 38 is larger than the cross-sectional area of top opening 34. In other embodiments, channel 22 may be tapered in only a single direction. In other embodiments, channel 22 may be tapered in any other manner. In the embodiment shown in FIG. 6, each heat pump 20A and 20B includes inter-digitated elements 46 within channel 22 to increase the surface area exposed to air flowing through channel 22, which increases conductive heat transfer.

Figure 7:
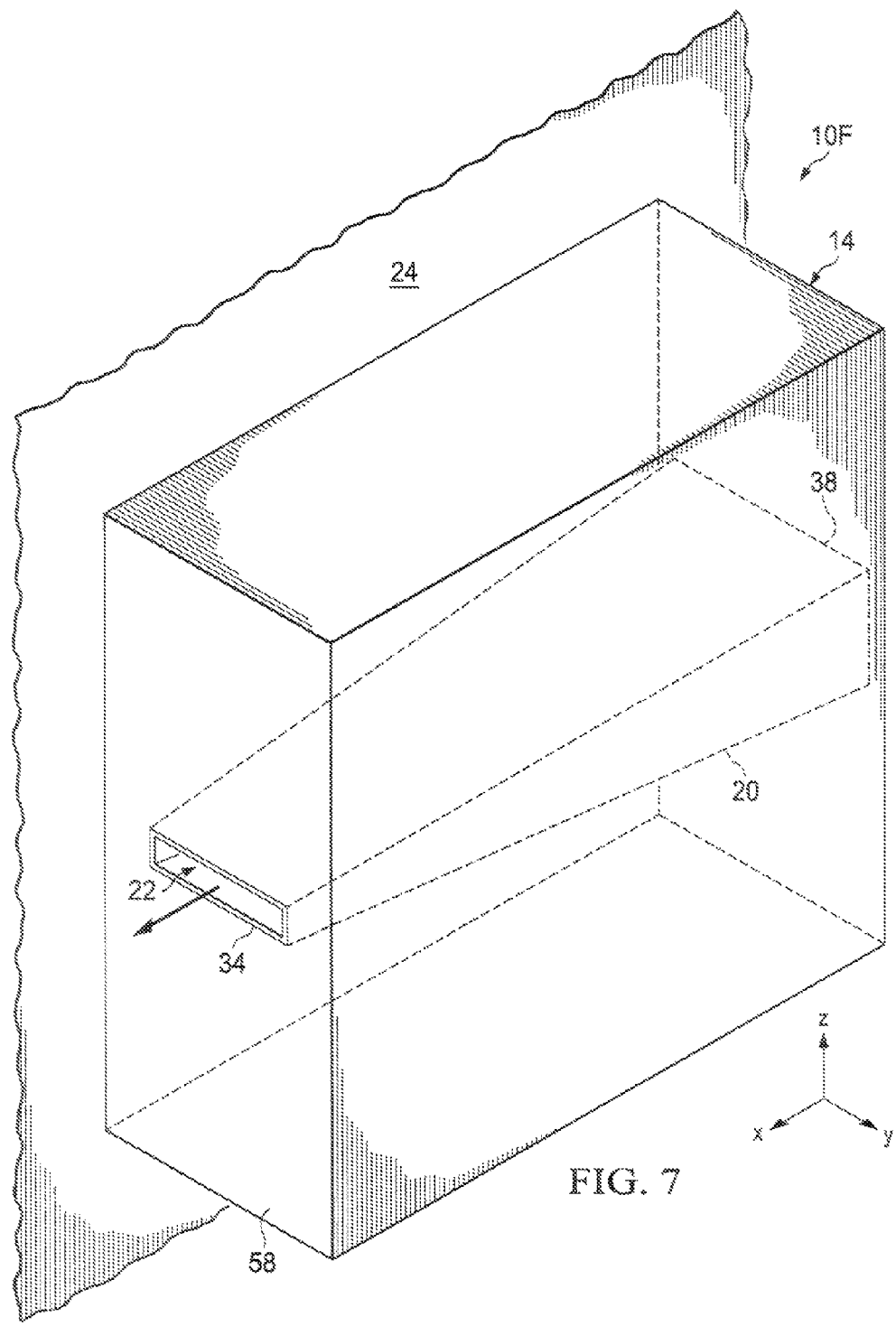
FIG. 7 illustrates an example heat transfer system that includes a heat pump having a generally horizontal, tapered channel, according to some embodiments.

FIG. 7 illustrates an example heat transfer system 10F for cooling electrical devices 12 located in an electrical housing 14. In this embodiment, a heat pump 20 extends substantially horizontally and has a tapered channel 22, which may accelerate or otherwise promote the flow of air through channel 22 in the direction toward the smaller end of tapered channel 22, as shown in FIG. 7. As shown, channel 22 may be tapered in both the y-direction and the z-direction, such that the y- and z-direction dimensions of opening 38 are larger than the x- and y-direction dimensions of opening 34. Thus, the cross-sectional area of opening 38 is larger than the cross-sectional area of opening 34. In other embodiments, channel 22 may be tapered in only a single direction. In other embodiments, channel 22 may be tapered in any other manner. Further, in some embodiments, directional vent structures 70, such as discussed above regarding FIG. 4, may be provided at one or both ends of channel 22 to facilitate and/or direct air flow through channel 22.

Therefore, the present invention is well adapted to attain the ends and advantages mentioned, as well as those that are inherent therein. The particular embodiments disclosed herein are illustrative only, as the invention may be modified and practiced in different but equivalent manners apparent to those having ordinary skill in the art and having the benefit of the teachings herein. While numerous changes may be made by those having ordinary skill in the art, such changes are encompassed within the spirit and scope of this invention as defined by the appended claims. Furthermore, no limitations are intended to the details of construction or design herein shown. It is therefore evident that the particular illustrative embodiments disclosed above may be altered or modified and all such variations are considered within the scope and spirit of the present invention.

What is claimed is:

1. A system for transferring heat from an electrical enclosure, comprising:
   an electrical enclosure that defines a housing area in which one or more electrical devices are housed; and
   a heat pump extending through the electrical enclosure, the heat pump defining a channel configured to communicate fluid for transferring heat from the one or more electrical devices,
   wherein the electrical enclosure is substantially sealed from the heat pump channel and from other areas outside the electrical enclosure,
   wherein the heat pump channel extends from a first end to a second end, and
   wherein the heat pump includes directional vent structures at one or both of the first and second ends of the heat pump channel to facilitate fluid flow through the channel.

2. The system according to claim 1, wherein the heat pump channel extends through two opposing sides of the electrical enclosure.

3. The system according to claim 1, wherein the heat pump channel extends substantially vertically through a top side and a bottom side of the electrical enclosure.

4. The system according to claim 1, wherein the heat pump channel extends substantially non-vertically through the electrical enclosure.

5. The system according to claim 1, wherein the heat pump channel extends substantially horizontally through two opposing lateral sides of the electrical enclosure.

6. The system according to claim 1, wherein:
   the heat pump channel extends substantially horizontally; and
   the directional vent structures extend at an askew angle relative to the heat pump channel.

7. The system according to claim 1, wherein the heat pump channel is tapered.

8. The system according to claim 1, wherein the heat pump includes inter-digitated elements.

9. The system according to claim 1, wherein the heat pump is located substantially within the electrical enclosure.

10. The system according to claim 1, wherein:
    a first wall of the electrical enclosure defines a first wall perimeter; and
    a first end of the heat pump channel defines an opening in the first wall of the electrical enclosure, the heat pump channel opening located within and distinct from the first wall perimeter.

11. The system according to claim 1, wherein:
    the heat pump is located substantially within the electrical enclosure; and
    the heat pump physically abuts a wall of the electrical enclosure extending in the direction of the heat pump.

12. The system according to claim 1, wherein at least one of the electrical devices is mounted on a wall of the heat pump or on a structure that physically abuts the wall of the heat pump.

13. The system according to claim 1, including multiple heat pumps extending through the electrical enclosure.

14. A system for transferring heat from an electrical enclosure, comprising:
    an electrical enclosure that defines a housing area in which one or more electrical devices are housed; and
    a plurality of heat pumps extending substantially vertically through the electrical enclosure, each heat pump defining a channel configured to communicate fluid for transferring heat from the one or more electrical devices;
    wherein each heat pump channel is tapered such that a cross-sectional area of a top end of the heat pump channel is smaller than a cross-sectional area of a bottom end of the heat pump channel; and
    wherein the electrical enclosure is substantially sealed from the plurality of heat pump channels and from other areas outside the electrical enclosure.

15. The system according to claim 14, wherein the heat pump includes inter-digitated elements.

16. The system according to claim 14, wherein each heat pump is located substantially within the electrical enclosure.

17. The system according to claim 14, wherein:
    a top surface of the electrical enclosure defines a top surface perimeter; and
    a top end of each heat pump channel defines an opening in the top surface of the electrical enclosure, each heat pump channel opening located within and distinct from the top surface perimeter.

18. The system according to claim 14, wherein at least one of the electrical devices is mounted on a wall of at least one of the heat pumps or on a structure that physically abuts a wall of at least one of the heat pumps.

19. A system for transferring heat from an electrical enclosure, comprising:
    an electrical enclosure that defines a housing area in which one or more electrical devices are housed; and
    a heat pump extending through the electrical enclosure, the heat pump defining a channel configured to communicate fluid for transferring heat from the one or more electrical devices,
    wherein the electrical enclosure is substantially sealed from the heat pump channel and from other areas outside the electrical enclosure,
    wherein a first end of the heat pump channel is located higher than a second end of the heat pump channel with respect to a horizontal plane, and wherein the heat pump channel is tapered such that a cross-sectional area of the first, higher end of the heat pump channel is smaller than a cross-sectional area of the second, lower end of the heat pump channel.

* * * * *